United States Patent
Feng et al.

(10) Patent No.: US 10,181,473 B2
(45) Date of Patent: Jan. 15, 2019

(54) SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Li-Wei Feng, Kaohsiung (TW); Ying-Chiao Wang, Changhua County (TW); Tsung-Ying Tsai, Kaohsiung (TW); Kai-Ping Chen, Tainan (TW); Chien-Ting Ho, Taichung (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/452,746

(22) Filed: Mar. 8, 2017

(65) Prior Publication Data
US 2018/0226408 A1    Aug. 9, 2018

(30) Foreign Application Priority Data

Feb. 3, 2017  (CN) .......................... 2017 1 0063718

(51) Int. Cl.
*H01L 27/108*  (2006.01)
*H01L 23/528*  (2006.01)

(52) U.S. Cl.
CPC .... *H01L 27/10885* (2013.01); *H01L 23/5283* (2013.01); *H01L 27/10897* (2013.01)

(58) Field of Classification Search
CPC ............. H01L 27/108; H01L 27/10805; H01L 27/1082; H01L 27/10876; H01L 27/10882; H01L 27/10885; H01L 27/10894; H01L 27/10897
See application file for complete search history.

(56) References Cited

U.S. PATENT DOCUMENTS

| | | | |
|---|---|---|---|
| 5,392,232 A * | 2/1995 | Kim ................ | H01L 27/10808 257/E27.081 |
| 5,694,369 A * | 12/1997 | Abe ....................... | G11C 7/14 365/189.05 |
| 9,379,114 B2 | 6/2016 | Jeong et al. | |
| 2006/0198231 A1 * | 9/2006 | Larguier ................ | G11C 8/08 365/230.06 |
| 2006/0203588 A1 * | 9/2006 | Ito ........................... | G11C 7/14 365/189.09 |
| 2011/0069524 A1 * | 3/2011 | Toba ..................... | G11C 5/063 365/63 |

* cited by examiner

*Primary Examiner* — Syed I Gheyas
(74) *Attorney, Agent, or Firm* — Winston Hsu

(57) ABSTRACT

A semiconductor device includes a substrate, plural active areas, plural bit lines and plural dummy bit lines. The substrate includes a cell region and a periphery region, and the active areas are defined on the substrate. The bit lines are disposed on the substrate, within the cell region and across the active areas. The dummy bit lines are disposed at a side of the bit lines, wherein the dummy bit lines are in contact with each other and have different pitches therebetween.

11 Claims, 4 Drawing Sheets

SEMICONDUCTOR DEVICE

BACKGROUND OF THE INVENTION

1. Field of the Invention

The invention relates to a semiconductor device, and more specifically to a dynamic random access memory (DRAM) device.

2. Description of the Prior Art

The trend in the memory industry, as well as the semiconductor industry, has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performance.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell to gain enhanced performance and reliability of the corresponding memory device.

SUMMARY OF THE INVENTION

It is one of the primary objectives of the present invention to provide a semiconductor device, in which plural dummy bit lines within the same bias are disposed at a side of the bit lines. Then, at least one end of each dummy bit line is connected with one other, so that, the process window of other regions in the semiconductor device, such as the cell region, may no longer be affected thereby.

To achieve the purpose described above, the present invention provides a semiconductor device including a substrate, a plurality of active areas, a plurality of bit lines and a plurality of dummy bit lines. The substrate includes a cell region and a periphery region, and the active areas are defined on the substrate. The bit lines are disposed on the substrate, within the cell region and across the active areas. The dummy bit lines are disposed at a side of the bit lines, wherein the dummy bit lines are in contact with each other and have different pitches therebetween.

Overall, the semiconductor device of the present invention includes a plurality of dummy bit lines disposed at a side of the bit lines, with those dummy bit lines being formed at least partially within a periphery region of the substrate, also indifferent pitches and widths. The dummy bit lines have a relative greater pitch and width than that of the bit lines, so that, the lithography process of the bit lines may no longer be affected by the forming process of the dummy bit lines under a OPC requirement. Also, since at least one end of each dummy bit lines is in contact with on another in sequence or alternately, the dummy bit lines may therefore obtain a closed rectangular shape or a serpent shape. That is, the dummy bit lines are allowed to be electrically connected to an external element through a single plug structure formed on the dummy bit lines, thereto obtain the same bias. Furthermore, the dummy bit lines in the aforementioned shape improve the elemental arrangement of the entire semiconductor device, and then, the process window of other regions in the semiconductor device may gain more improvements accordingly.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
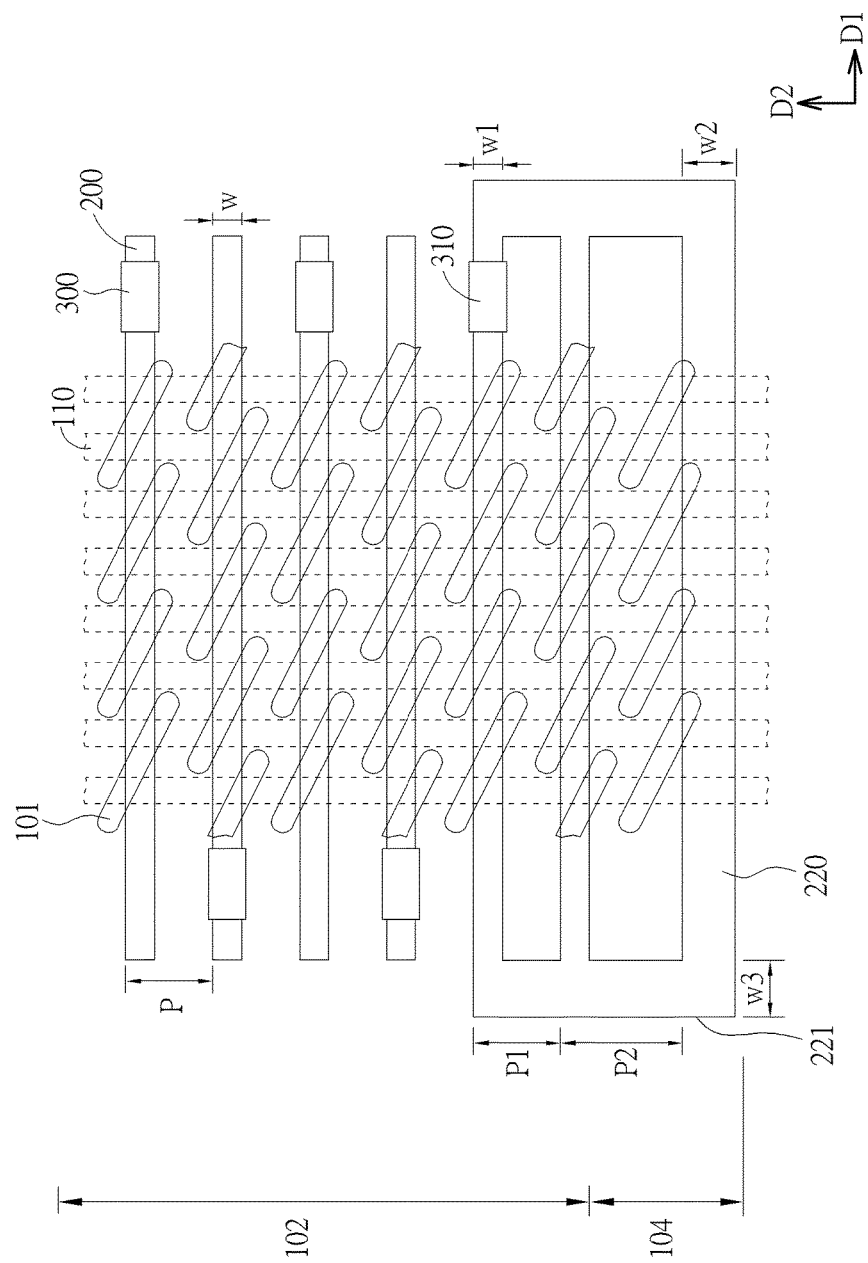
FIG. 1 is a schematic diagram illustrating a semiconductor device according to a first preferred embodiment of the present invention.

Referring to FIG. 1, the semiconductor device according to the first preferred embodiment of the present invention is provided. In the present embodiment, the semiconductor device for example includes a memory cell device such as a dynamic random access memory (DRAM) device, and the DRAM device includes at least one transistor (not shown in the drawings) and at least one capacitor (not shown in the drawings), thereto serve as the smallest unit in the DRAM array for accepting signals from bit lines (BL) 200 and the word lines (WL) 110 during the operation.

The memory cell includes a substrate 100, for example a silicon substrate, a silicon containing substrate such as SiC or SiGe, or a silicon-on-insulator (SOI) substrate, wherein a cell region 102 and a periphery region 104 are defined thereon, as shown in FIG. 1. Moreover, at least one shallow trench isolation (STI) 103 is formed in the substrate 100 to define a plurality of active areas (AA) 101 parallelly extended along a first direction (not shown in the drawings) on the substrate 100. In the present embodiment, the active areas 101 are formed both within the cell region 102 and the periphery region 104. However, in another embodiment, the active areas may also be formed only in the cell region 102 of the substrate 100. Then, a plurality of buried gates (not shown in the drawings) is formed in the substrate 100, and the buried gates are parallelly extended along a second direction D2 which is different from the first direction, across below the active areas 101, so as to function like buried word lines (BWL) 110.

On the other hand, a plurality of bit lines 200 are formed on the substrate 100, and the bit lines 200 are parallelly extended along a third direction D1 which is different from the first direction and the second direction D2, to cross the active areas 101 and the buried word lines 110 at the same time. In the present embodiment, the third direction D1 is preferably perpendicular to the second direction D2, as shown in FIG. 1. In one embodiment, the bit lines are preferably formed only in the cell region 102, and each of the bit line includes a semiconductor layer (not shown in the drawings), a barrier layer (not shown in the drawings) and a metal layer (not shown in the drawings). Also, a bit line contact (BLC, not shown in the drawings) is further formed under a portion of the bit lines 200, preferably between two buried word lines 110 in the substrate 100, to electrically connect to a source/drain region (not shown in the drawings) in the transistor.

Precisely, each bit line 200 has a stripe shape and is disposed separately on the substrate 100. Preferably, the bit lines 200 are in the same width W, and are spaced from each other by the same pitch P, but is not limited thereto. Then, the bit lines 200 are electrically connected to an external circuit via plugs 300 which are disposed in an insulating layer (not shown in the drawings) over the bit lines 200. It is noted that, in one embodiment, the plugs 300 are alternately disposed at one end of the bit lines 200. For example, when a plug 300 is disposed at a left end of one bit line 200, and other plugs 300 may be disposed at right ends of the bit lines 200 adjoined the one bit line 200, as shown in FIG. 1. However, in another embodiment, each plug (not shown in the drawings) may also be disposed at other proper positions for electrically connecting to each bit line 200.

In the present embodiment, a plurality of dummy bit lines 220 is further formed at a side of the bit lines 200, and at least a portion of the dummy bit lines 220 are disposed in the periphery region 104 of the substrate 100. The dummy bit lines 220 may have the same pitch or different pitches P1, P2 as shown in FIG. 1. For example, the dummy bit line 220 which is close to the bit lines 200 may have a relative smaller pitch, such as the pitch P1 which is the same as the pitch P of the bit lines 200, and the dummy bit line 220 which is far away from the bit lines 200 may have a relative greater pitch, such as the pitch P2 which is greater than the pitch P of the bit lines 200. On the other hand, the dummy bit lines 220 may have the same width or different width W1, W2 as shown in FIG. 1. For example, the dummy bit line 220 which is close to the bit lines 200 has a relative smaller width, such as the width W1 which is the same as the width W of the bit lines 200, and the dummy bit line 220 which is far away from the bit lines 200 has a relative greater width, such as the width W2 which is greater than the width W of the bit lines 220.

It is noteworthy that, two connection portions 221 are further protruded from two ends of the dummy bit lines 220 respectively, and the connection portions 221 are extended along the second direction D2 to connect two opposite ends of each dummy bit lines 220, respectively. In other words, due to the disposition of the connection portions 221, the dummy bit lines 220 may have a closed rectangular frame, as shown in FIG. 1. In this way, while a plug 310 is formed over any one of the dummy bit lines 220, the same bias is provided to all of the dummy bit lines 200. In one embodiment, the plug 310 electrically connected to the dummy bit lines 220 and the plugs 300 electrically connected to the bit lines 220 may be formed simultaneously through the same process, but is not limited thereto. Then, it is also noted that, the connection portions 221 have a width W3 in the third direction D1, and the width W3 is preferably greater than the width W of the bit lines 200. Also, the connection portions 221 are protruded from two ends of the bit lines 200 in the second direction D2, as shown in FIG. 1. That is, while forming the bit lines 200 and the dummy bit lines 220 through a lithography and etching process, the formation of the bit lines 200 will no longer be affected by the formation of the dummy bit lines 220, in particular the connection portions 221.

Through the aforementioned processes, the semiconductor device according to the first preferred embodiment is obtained. According to the present embodiment, the dummy bit lines 220 are further disposed at a side of the bit lines 200, with the dummy bit lines 220 parallely extending along the third direction D1 in different pitches P1, P2 and in different widths W1, W2. Among those dummy bit lines 220, the one which is far away from the bit lines 200 may obtain the greatest pitch P2 and the greatest width W2. Also, the dummy bit lines 220 are in contact with one another through the connection portions 221 extended outwardly from two ends of each dummy bit lines 220. That is, in the subsequent process, only one plug 310 is requested to be disposed on any one of the dummy bit lines 220, to electrically connect all the dummy bit lines to an active element (not shown in the drawings) to obtain the same bias.

The following description will detail the different embodiments of a semiconductor device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 2:
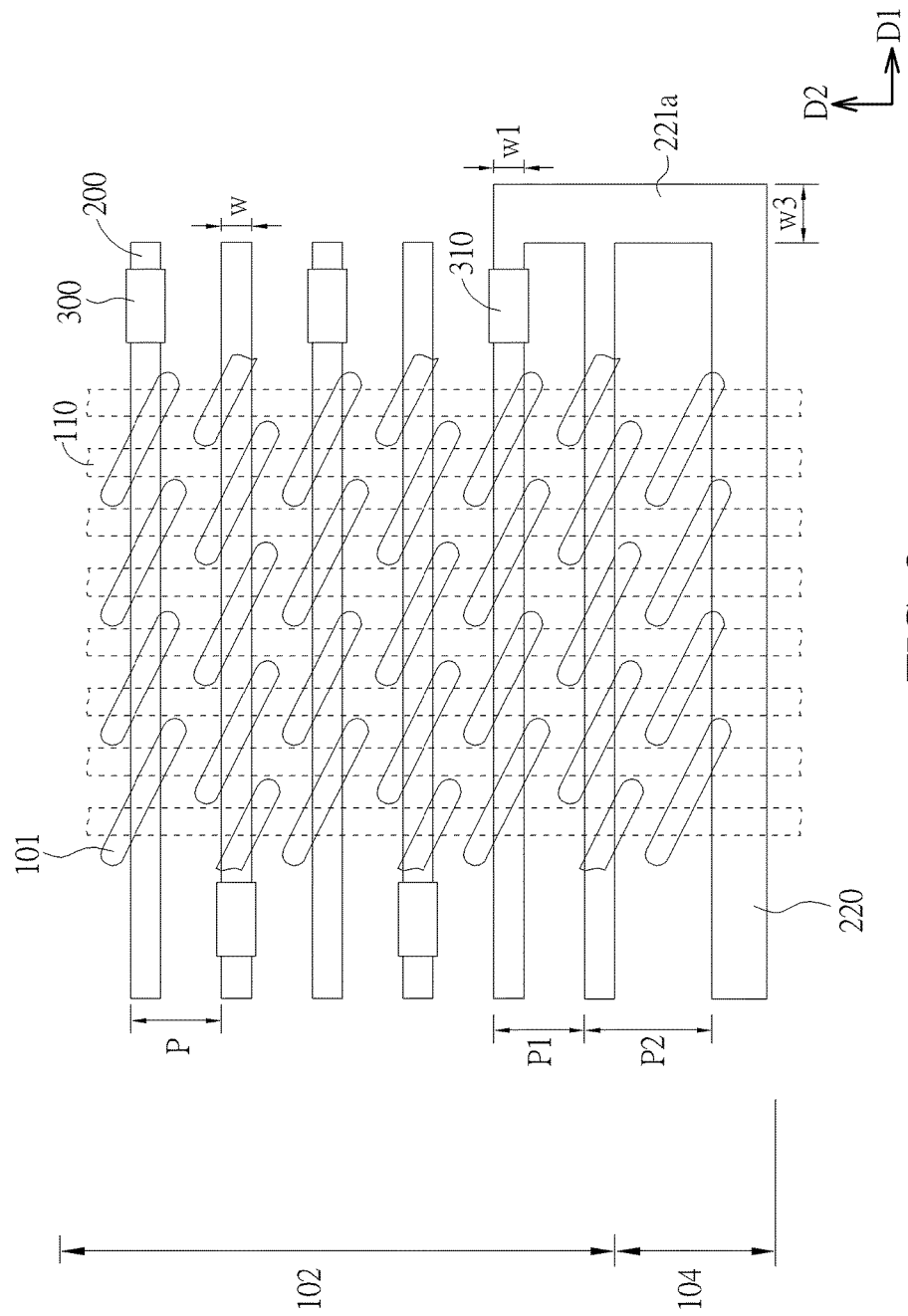
FIG. 2 is a schematic diagram illustrating a semiconductor device according to a second preferred embodiment of the present invention.

Referring to FIG. 2, the semiconductor device according to the second preferred embodiment is provided. The structure of the semiconductor device in the present embodiment is substantially similar to that in the first preferred embodiment, and the similarities therebetween will not be further detailed herein. The difference between the present embodiment and the aforementioned first preferred embodiment is in that, only one end of each dummy bit lines 220 is connected with one another.

Precisely, as shown in FIG. 2, the semiconductor device of the present embodiment includes a connection portion 221a disposed only at one end, such as the right end, of each dummy bit lines 220. That is, the other end such as the left end of each dummy bit lines 220 are vertically aligned with the left ends of the bit lines 200 in the second direction D2, as shown in FIG. 2. However, in another embodiment, the connection portion (not shown in the drawings) may also be disposed only at the left ends of each dummy bit lines 220, so that, the right ends of the dummy bit lines 220 may be vertically aligned with the right ends of the bit lines 200 in the second direction D2.

Through the aforementioned processes, the semiconductor device according to the second preferred embodiment is obtained. According to the present embodiment, each of the dummy bit lines 220 are connected with one another only through one connection portion 221a disposed at one end of each dummy bit lines 220. In this way, the dummy bit lines 220 may also be electrically connected to the active element through the plug 310 disposed on any one of the dummy bit lines 220, for obtaining the same bias. Furthermore, since the connection portion disposed in another end of the dummy bit lines 220 has been omitted, the elemental arrangement of the semiconductor device in the present embodiment may be more flexible. Then, the process window in the memory cell region 102 may no longer be affected by the formation of the dummy bit lines 220.

Figure 3:
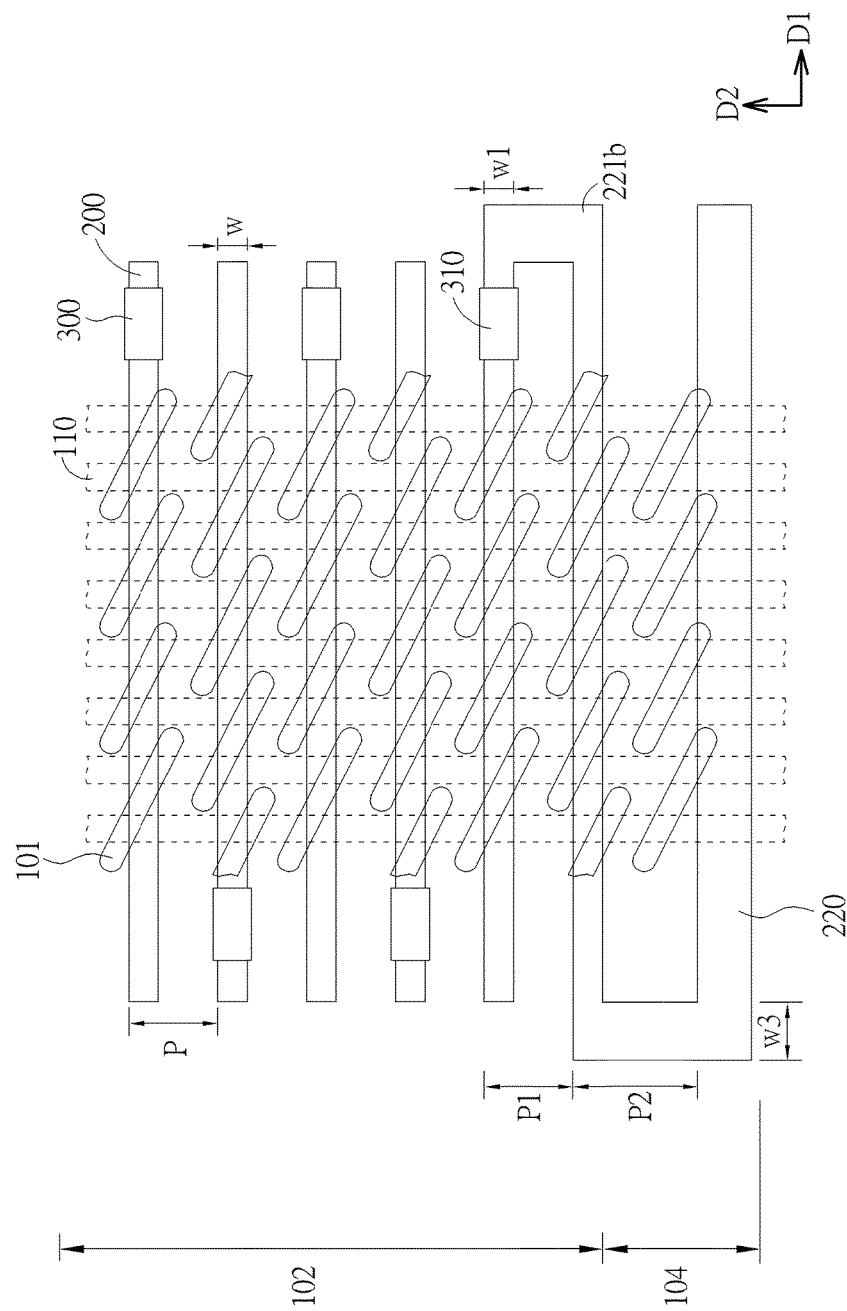
FIG. 3 is a schematic diagram illustrating a semiconductor device according to a third preferred embodiment of the present invention.

Referring to FIG. 3, the semiconductor device according to the second preferred embodiment is provided. The structure of the semiconductor device in the present embodiment is substantially similar to that in the first preferred embodiment, and the similarities therebetween will not be further detailed herein. The difference between the present embodiment and the aforementioned first preferred embodiment is in that, the dummy bit lines 220a of the present embodiment have a serpent shape.

Precisely, as shown in FIG. 3, the semiconductor device of the present embodiment also includes the dummy bit lines 220a which are parallelly extended along the third direction D1, and the dummy bit lines 220a are in contact with one another via the connection portions 221b disposed alternately at two ends of the dummy bit lines 220a. That is, the entire profile of the dummy bit lines 220a may be in a serpent shape. It is noted that, one end of the dummy bit line 220a which is close to the bit lines 200, may be vertically aligned with the ends of each bit lines 200 in the second direction D2, as shown in FIG. 3.

Through the aforementioned processes, the semiconductor device according to the third preferred embodiment is obtained. According to the present embodiment, the dummy bit lines 220a in a serpent shape is formed, so that, the dummy bit lines 220a may also be electrically connected to the active element through the plug 310 formed subsequently on any one of the dummy bit lines 220, for obtaining the same bias. Furthermore, since the connection portions 221b are disposed alternately at two ends of the dummy bit lines 220a, the elemental arrangement of the semiconductor device in the present embodiment may be further flexible. Then, the process window in the memory cell region 102 may no longer be affected by the formation of the dummy bit lines 220a.

Figure 4:
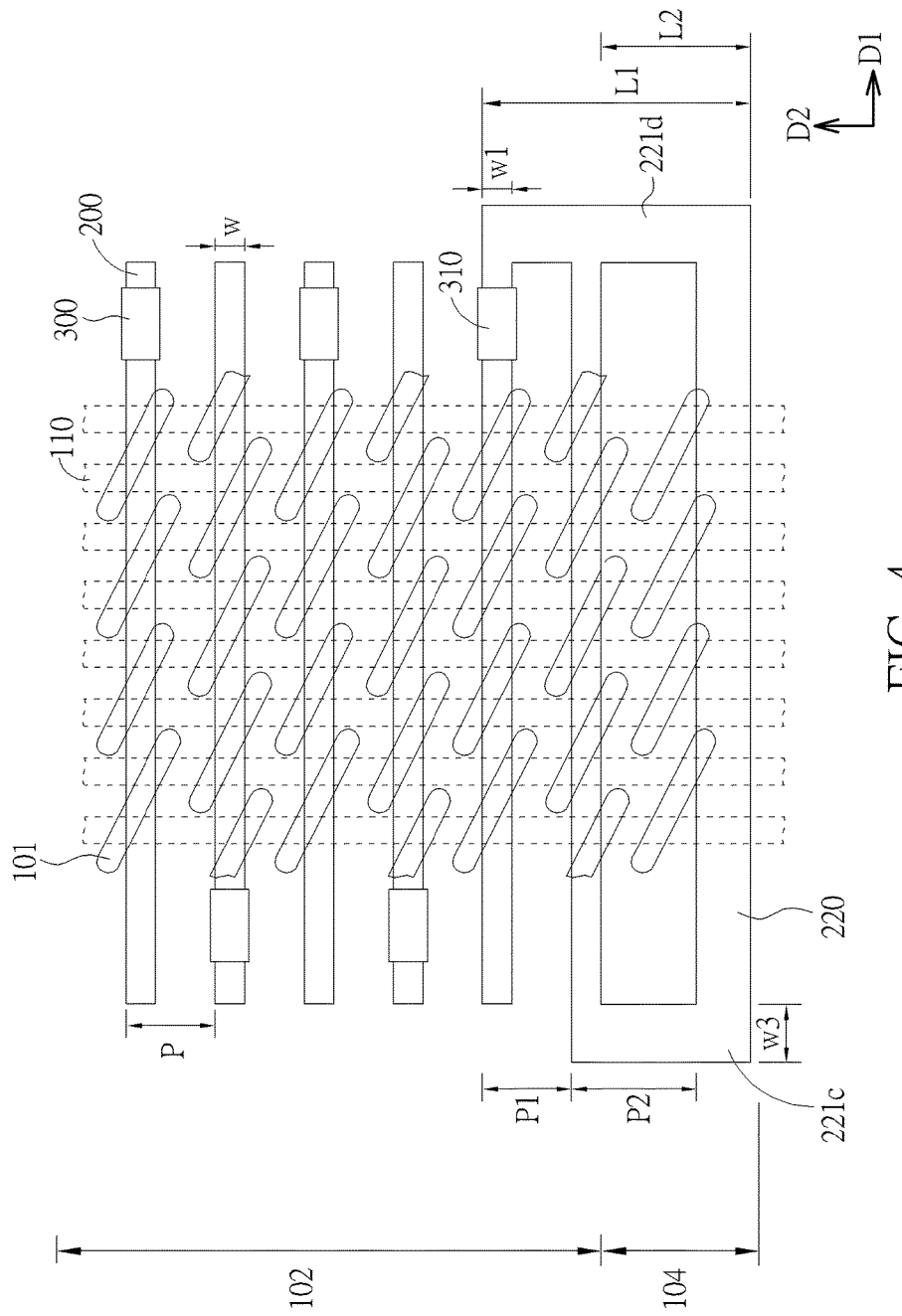
FIG. 4 is a schematic diagram illustrating a semiconductor device according to a fourth preferred embodiment of the present invention.

Referring to FIG. 4, the semiconductor device according to the fourth preferred embodiment is provided. The structure of the semiconductor device in the present embodiment is substantially similar to that in the first preferred embodiment, and the similarities therebetween will not be further detailed herein. The difference between the present embodiment and the aforementioned first preferred embodiment is in that, the connection portions 221c, 221d disposed at two ends of each dummy bit lines 220 for connecting thereto have different lengths L1, L2.

Precisely, as shown in FIG. 4, the connection portions 221c, 221d are disposed respectively at two opposite ends of each dummy bit lines 220, wherein the connection portion 221c disposed at one end such as the left end of each dummy bit lines 220 connects fewer dummy bit lines 220, and the connection portion 221d disposed at the opposite end such as the right end of each dummy bit lines 220 connects more dummy bit lines 220. That is, the connection portion 221c may obtain a relative smaller length L2, and the connection portion 221d may obtain a relative greater length L1. In other words, the connection portion 221c disposed at the left ends of the dummy bit lines 220 in the present embodiment is optionally not in contact with at least one dummy bit line 220 which is close to the bit lines 200. That is, the left end of the dummy bit line which is not in contact with the connection portion 221c may be vertically aligned with the left ends of the bit lines 200 in the second direction D2, as shown in FIG. 4. In another embodiment, the connection portion (not shown in the drawings) disposed at the right ends of the dummy bit lines 220 may also be selectively formed to not be in contact with at least one dummy bit line 220 which is close to the bit lines 200.

Through the aforementioned processes, the semiconductor device according to the fourth preferred embodiment is obtained. According to the present embodiment, the connection portion 221c disposed at one end of the dummy bit lines are optionally not in contact with at least one dummy bit line 220 which is close to the bit lines 200, so that, the dummy bit lines 220 may also be electrically connected to the active element through the plug 310 formed subsequently on any one of the dummy bit lines 220, for obtaining the same bias. Also, since the connection portion 221c of the present embodiment has a relative smaller length L2, the elemental arrangement of the semiconductor device in the present embodiment may be quite flexible. Then, the process window in the memory cell region 102 may no longer be affected by the formation of the dummy bit lines 220.

Through the present invention, the DRAM device is provided, and the DRAM device includes plural dummy bit lines disposed at a side of the bit lines, with those dummy bit lines being at least partially formed in a periphery region of the substrate, in different pitches and widths. For example, among those dummy bit lines, the one which is close to the bit lines may have a relative smaller width and/or pitch, such as a width/pitch being the same as the width/pitch of the bit lines, and the one which is far away from the bit lines may have a relative greater width and/or pitch, such as a width/pitch being greater than the width/pitch of the bit lines. In this way, while performing a lithography process of the bit lines, the formation of the bit lines in a relative smaller width and/or pitch will no longer be affected by the formation of the dummy bit lines in a relative greater width and/or pitch. Moreover, since at least one end of each dummy bit line is in contact with each other in sequence or alternately, the dummy bit lines may therefore obtain a closed rectangular shape or a serpent shape. That is, the dummy bit lines are allowed to be electrically connected to an external element through a single plug structure formed on the dummy bit lines, and the dummy bit lines are in the same bias. Meanwhile, the dummy bit lines in the aforementioned shape improve the elemental arrangement of the entire semiconductor device, and then, the process window of other regions in the semiconductor device may gain more improvements accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a cell region and a periphery region;
   a plurality of active areas, defined on the substrate;
   a plurality of bit lines, parallelly and separately disposed on the substrate, within the cell region and across the active areas; and
   a plurality of dummy bit lines, disposed at a side of the bit lines, wherein the dummy bit lines are in contact with each other and have different pitches therebetween, and the dummy bit lines have different widths with one of the dummy bit lines which is away from the bit lines having a width being greater than a width of others of the dummy bit lines, wherein a portion of the dummy bit lines is disposed within the cell region, the portion of the dummy bit lines has a same pitch and width as that of the bit lines, and another portion of the dummy bit lines is disposed within the periphery region and has a different pitch and a different width from that of the bit lines, and the dummy bit lines further comprise a connection portion to connect one of the dummy bit lines to one another, wherein the connection portion is disposed beyond one end of the bit lines and has a width being greater than a width of the bit lines.

2. The semiconductor device according to claim 1, wherein one end of each of the dummy bit lines is connected with one another.

3. The semiconductor device according to claim 2, wherein another end of each of the dummy bit lines is also connected with one another.

4. The semiconductor device according to claim 1, wherein the dummy bit line which is away from the bit lines has a pitch being greater than a pitch between other dummy bit lines.

5. The semiconductor device according to claim 1, wherein the dummy bit lines comprise a serpent shape.

6. The semiconductor device according to claim 1, wherein the dummy bit lines comprise a closed rectangular frame.

7. The semiconductor device according to claim 1, wherein the connection portion is disposed at one end of the dummy bit lines.

8. The semiconductor device according to claim 1, wherein a plurality of the connection portions are alternately disposed at two ends of the dummy bit lines.

9. The semiconductor device according to claim 7, wherein the dummy bit lines further comprise another connection portion, and the another connection portion is disposed at another end of the dummy bit lines.

10. The semiconductor device according to claim 9, wherein the two connection portions have different lengths.

11. The semiconductor device according to claim 1, further comprising:
   a plurality of plugs being disposed within the cell region but not in the periphery region, and without plugs disposed between adjacent dummy bit lines.

* * * * *